(12) United States Patent
Huang et al.

(10) Patent No.: US 8,603,911 B2
(45) Date of Patent: Dec. 10, 2013

(54) SEMICONDUCTOR DEVICE AND FABRICATION METHOD THEREOF

(75) Inventors: Hui-Min Huang, Taichung (TW); Chun-Tang Lin, Taichung (TW); Chien-Wei Lee, Taichung (TW); Yen-Ping Wang, Taichung (TW)

(73) Assignee: Siliconware Precision Industries Co., Ltd., Taichung (TW)

(*) Notice: Subject to any disclaimer, the term of this patent is extended or adjusted under 35 U.S.C. 154(b) by 0 days.

(21) Appl. No.: 13/105,338

(22) Filed: May 11, 2011

(65) Prior Publication Data

US 2012/0223425 A1    Sep. 6, 2012

(30) Foreign Application Priority Data

Mar. 2, 2011   (TW) .............................. 100106830 A

(51) Int. Cl.
H01L 21/44    (2006.01)
H01L 23/12    (2006.01)
H01L 29/40    (2006.01)

(52) U.S. Cl.
USPC .......................... 438/615; 438/614; 257/737

(58) Field of Classification Search
USPC .................... 257/737; 438/614, 615
See application file for complete search history.

(56) References Cited

U.S. PATENT DOCUMENTS

| | | | |
|---|---|---|---|
| 6,008,534 A | 12/1999 | Fulcher | |
| 6,181,569 B1* | 1/2001 | Chakravorty | 361/761 |
| 6,225,704 B1 | 5/2001 | Sumita et al. | |
| 6,372,544 B1 | 4/2002 | Halderman et al. | |
| 6,707,157 B2* | 3/2004 | Hoshino | 257/773 |
| 7,352,063 B2* | 4/2008 | Noguchi | 257/707 |
| 7,459,393 B2* | 12/2008 | Farnworth et al. | 438/667 |
| 7,514,786 B2* | 4/2009 | Hsu | 257/737 |
| 7,838,997 B2* | 11/2010 | Trezza | 257/778 |
| 7,919,835 B2* | 4/2011 | Akiyama | 257/621 |
| 8,018,052 B2* | 9/2011 | Kim et al. | 257/710 |
| 2001/0005046 A1* | 6/2001 | Hsuan et al. | 257/686 |
| 2002/0027293 A1* | 3/2002 | Hoshino | 257/774 |
| 2002/0030273 A1* | 3/2002 | Iwamoto et al. | 257/737 |
| 2003/0199159 A1* | 10/2003 | Fan et al. | 438/612 |
| 2005/0048698 A1* | 3/2005 | Yamaguchi | 438/109 |
| 2005/0101040 A1* | 5/2005 | Lai et al. | 438/21 |
| 2005/0221601 A1* | 10/2005 | Kawano | 438/622 |

(Continued)

FOREIGN PATENT DOCUMENTS

TW    I309464    7/1994

*Primary Examiner* — Jae Lee
*Assistant Examiner* — Grant Withers
(74) *Attorney, Agent, or Firm* — Edwards Wildman Palmer LLP; Peter F. Corless; Steven M. Jensen

(57) ABSTRACT

A semiconductor structure includes a chip, a plurality of metal posts disposed in the chip and a buffer layer disposed on the chip. The chip includes a silicon-based layer having opposite first and second surfaces, and a build-up structure formed on the first surface of the silicon-based layer consisting of at least a metal layer and a low-k dielectric layer alternatively stacked on one another. Each of the metal posts is disposed in the silicon-based layer with one end thereof electrically connected with the metal layer while the other end is exposed from the second surface of the silicon-based layer. The buffer layer is disposed on the build-up structure. By positioning the low-k dielectric layer far from the second surface that is used for connecting to an external electronic component, the present invention reduces the overall thermal stress.

14 Claims, 4 Drawing Sheets

(56) References Cited

U.S. PATENT DOCUMENTS

| | | | |
|---|---|---|---|
| 2005/0233581 A1* | 10/2005 | Soejima et al. | 438/667 |
| 2006/0121690 A1* | 6/2006 | Pogge et al. | 438/455 |
| 2006/0131728 A1* | 6/2006 | Salmon | 257/698 |
| 2008/0157358 A1* | 7/2008 | Yang | 257/737 |
| 2008/0206990 A1* | 8/2008 | Wood et al. | 438/667 |
| 2009/0152602 A1* | 6/2009 | Akiyama | 257/288 |
| 2009/0321796 A1* | 12/2009 | Inohara | 257/288 |
| 2010/0072579 A1* | 3/2010 | Thies et al. | 257/621 |
| 2010/0155937 A1* | 6/2010 | Hsu et al. | 257/737 |
| 2010/0164062 A1* | 7/2010 | Wang et al. | 257/532 |
| 2010/0164117 A1* | 7/2010 | Chen | 257/774 |
| 2010/0178761 A1* | 7/2010 | Chen et al. | 438/613 |
| 2010/0193954 A1* | 8/2010 | Liu et al. | 257/751 |
| 2010/0244218 A1* | 9/2010 | Chai et al. | 257/686 |
| 2010/0301474 A1* | 12/2010 | Yang | 257/737 |
| 2010/0301484 A1* | 12/2010 | Bchir et al. | 257/766 |
| 2011/0037169 A1* | 2/2011 | Pagaila | 257/737 |
| 2012/0018876 A1* | 1/2012 | Wu et al. | 257/737 |
| 2012/0018881 A1* | 1/2012 | Pagaila | 257/737 |
| 2012/0018882 A1* | 1/2012 | Shim et al. | 257/737 |
| 2012/0056316 A1* | 3/2012 | Pagaila et al. | 257/737 |

* cited by examiner

SEMICONDUCTOR DEVICE AND FABRICATION METHOD THEREOF

CROSS-REFERENCES TO RELATED APPLICATIONS

This application claims under 35 U.S.C. §119(a) the benefit of Taiwanese Application No. 100106830, filed Mar. 2, 2011, the entire contents of which is incorporated herein by reference.

BACKGROUND OF THE INVENTION

1. Field of the Invention

The present invention relates to semiconductor devices and fabrication methods thereof, and, more particularly, to a semiconductor device having a low-k dielectric layer and a fabrication method thereof.

2. Description of Related Art

Generally, flip-chip mounting involves electrically connecting an active surface of a chip (or other semiconductor structures) to one surface of a substrate through a plurality of metal bumps, and mounting a plurality of solder balls serving as I/O connections on the other surface of the substrate, as disclosed in U.S. Pat. No. 6,008,534, U.S. Pat. No. 6,225,704, and U.S. Pat. No. 6,372,544. The flip-chip mounting technology leads to a reduced size of the overall package structure, and also eliminates the need of bonding wires, thereby reducing the resistance, improving the electrical performance and avoiding signal distortions during transmission. Therefore, flip-chip mounting technology has currently become a popular technology for mounting chips to other electronic components.

Further, along with the miniaturization of electronic products, the minimum line width and pitch in a wafer process can reach 40 nm and even 28 nm. However, electromagnetic noise or inductive effects can easily occur in a fine-pitch semiconductor chip, thus adversely affecting the electrical performance of the semiconductor chip. Accordingly, after circuit layout of the chip is completed, a low-k dielectric layer, which typically has a dielectric constant k less than 3.9, is formed to cover the chip so as to improve the electrical performance and address the above-described problems of electromagnetic noise or inductive effects.

However, the low-k dielectric layer has a high coefficient of thermal expansion (CTE) and a low elastic modulus and is generally brittle. Therefore, it is more sensitive to thermal stress than other materials. Furthermore, due to a large difference between the coefficients of thermal expansion of the low-k dielectric layer and the chip material, high thermal stress can occur under heat, which can easily cause circuit or interface delamination or cracking.

Accordingly, Taiwan Patent No. I309464 proposes a solution to overcome the above-described problems. However, the proposed solution requires an additional carrier board such that the chip can be disposed in a cavity of the carrier board, thereby greatly increasing the overall fabrication cost and time.

Therefore, there is a need to provide a semiconductor structure and a fabrication method thereof that can avoid high thermal stress during flip-chip processing, thereby improving the product yield and reducing the fabrication cost and time.

SUMMARY OF THE INVENTION

Accordingly, the present invention provides a semiconductor device, which comprises: a chip having a silicon-based layer with opposite first and second surfaces and a build-up structure formed on the first surface of the silicon-based layer comprising at least a metal layer and a low-k dielectric layer alternately stacked on one another; a plurality of metal posts disposed in the silicon-based layer, each metal post having one end thereof electrically connected with the metal layer and the other end exposed from the second surface of the silicon-based layer; and a buffer layer formed on the build-up structure.

The above-described semiconductor device can further comprise a plurality of conductive elements disposed on the second surface of the silicon-based layer and electrically connected with the metal posts.

The above-described semiconductor device can further comprise a top metal layer formed between the build-up structure and the buffer layer and electrically connected to the metal layer.

The top metal layer can be further electrically connected to the metal posts.

The above-described semiconductor device can further comprise a first insulating layer formed between the build-up structure and the buffer layer for covering the top metal layer, the first insulating layer having a plurality of openings for correspondingly exposing the top metal layer.

In the above-described semiconductor device, the buffer layer can be made of silicone or other encapsulating materials, and the low-k dielectric layer can have a dielectric constant less than 3.9.

The above-described device can further comprise a second insulating layer disposed on the second surface of the silicon-based layer and having a plurality of openings for correspondingly exposing the conductive elements.

The above-described structure can further comprise a second insulating layer formed on the second surface of the silicon-based layer and having a plurality of openings for correspondingly exposing the metal posts, wherein the conductive elements comprise a UBM (under bump metallurgy) layer formed on the metal posts exposed through the openings of the second insulating layer and surfaces of the second insulating layer around the exposed metal posts, and a plurality of metal bumps implanted on the UBM layer.

The above-described structure can further comprise a second insulating layer formed on the second surface of the silicon-based layer and having a plurality of openings, wherein the conductive elements comprise a wiring layer with portions thereof correspondingly exposed from the openings of the second insulating layer, a UBM layer formed on the portions of the wiring layer exposed through the openings of the second insulating layer and surfaces of the second insulating layer around the exposed portions of the wiring layer, and a plurality of metal bumps implanted on the UBM layer.

The present invention further provides a fabrication method of a semiconductor structure, which comprises the steps of: providing a chip having a silicon-based layer and a build-up device, wherein the silicon-based layer has opposite first and second surfaces, and the build-up structure is disposed on the first surface and comprises at least a metal layer and a low-k dielectric layer alternately stacked on one another, a plurality of metal posts being disposed in the silicon-based layer and each having one end thereof electrically connected with the metal layer; forming a buffer layer on the build-up structure; and removing a part of the chip from the second surface so as to expose the other end of each of the metal posts.

The above-described method can further comprise the step of forming a plurality of conductive elements on the second surface of the silicon-based layer, the conductive elements being electrically connected with the metal posts.

In the above-described method, the chip can further comprise a top metal layer formed on the build-up structure and electrically connected to the metal layer. Alternatively, the method can further comprise forming a top metal layer on the build-up structure and electrically connecting the top metal layer and the metal layer, and forming a buffer layer on the top metal layer.

In the above-described method, the top metal layer can be further electrically connected to the metal posts.

The method can further comprise the steps of: forming a first insulating layer on the build-up structure and the top metal layer, the first insulating layer having a plurality of openings for correspondingly exposing the top metal layer; and forming the buffer layer on the first insulating layer.

In the above-described method, the buffer layer can be made of silicone or other encapsulating materials, and the low-k dielectric layer can have a dielectric constant less than 3.9.

The method can further comprise the step of forming a second insulating layer on the second surface, the second insulating layer having a plurality of openings for correspondingly exposing the conductive elements.

The method can further comprise the step of forming a second insulating layer on the second surface, wherein the second insulating layer has a plurality of openings for correspondingly exposing the metal posts, and the conductive elements comprise a UBM layer formed on the metal posts exposed through the openings of the second insulating layer and surfaces of the second insulating layer around the exposed metal posts, and a plurality of metal implanted disposed on the UBM layer.

The method can further comprise the step of forming a second insulating layer on the second surface, wherein the second insulating layer has a plurality of openings, and the conductive elements comprise a wiring layer with portions thereof correspondingly exposed from the openings of the second insulating layer, a UBM layer formed on the portions of the wiring layer exposed through the openings of the second insulating layer and surfaces of the second insulating layer around the exposed portions of the wiring layer, and a plurality of metal bumps implanted on the UBM layer.

Since the low-k dielectric layer of the semiconductor device of the present invention is disposed far from the flip-chip mounting surface of the semiconductor structure, the present invention avoids the generation of high thermal stress during the flip-chip process due to mismatch of the coefficients of thermal expansion of the low-k dielectric layer and an adjacent material, thereby avoiding circuit or interface delamination or cracking. Further, the buffer layer covering the low-k dielectric layer can protect the low-k dielectric layer against damage caused by external influences. Furthermore, the semiconductor structure eliminates the need of a carrier board as in the prior art, thereby reducing the fabrication cost. In addition, the present invention allows the fabrication processes to be performed at the wafer level so as to save fabrication time and cost.

DETAILED DESCRIPTION OF PREFERRED EMBODIMENTS

The following illustrative embodiments are provided to illustrate the disclosure of the present invention and its advantages, these and other advantages and effects being apparent to those in the art after reading this specification.

It should be noted that the drawings are not intended to limit the present invention. Various modifications and variations can be made without departing from the spirit of the present invention. Further, terms such as "one", "above", etc. are merely for illustrative purposes and should not be construed to limit the scope of the present invention.

FIGS. 1A to 1F are cross-sectional views showing a semiconductor device and a fabrication method thereof according to the present invention, wherein 1D' and 1F' show other embodiments of 1D and 1F, respectively.

Figure 1A:
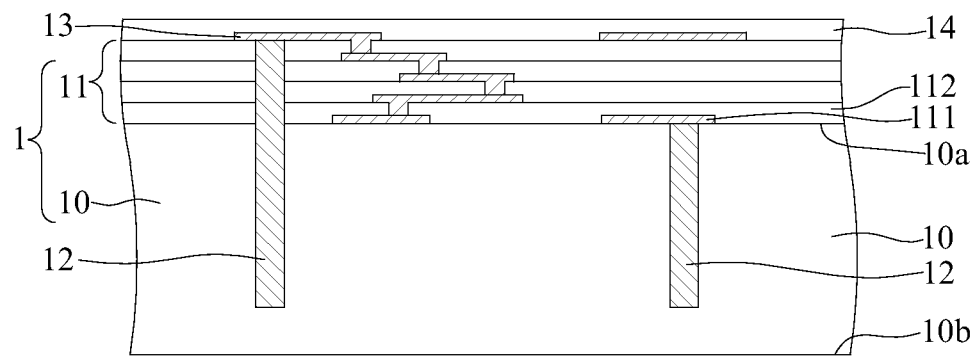
FIGS. 1A to 1F are cross-sectional views showing a semiconductor device and a fabrication method thereof according to the present invention, wherein FIG. 1D' shows another embodiment of FIG. 1D, and FIG. 1F' shows another embodiment of FIG. 1F.

Referring to FIG. 1A, a chip 1 is provided, which has a silicon-based layer 10 having opposite first and second surfaces 10a, 10b, and a build-up structure 11 formed on the first surface 10a of the silicon-based layer 10 comprising at least a metal layer 111 and a low-k dielectric layer 112 alternately stacked on one another. Further, a plurality of metal posts 12 are disposed in the silicon-based layer 10, and each of the metal posts has one end electrically connected with the metal layer 111. For simplicity, only one metal post 12 is shown in the drawing. Furthermore, a top metal layer 13 is formed on the build-up structure 11 and electrically connected to the metal posts 12 and the metal layer 111, and a first insulating layer 14 is formed on the build-up structure 11 and the top metal layer 13. In other embodiments, the metal posts 12 can electrically connect with any one of the metal layers 111 of the build-up structure 11. The low-k dielectric layer 112 is made of a low-k material. A reduced dielectric constant helps to reduce leakage current of integrated circuits, decrease capacitive effects between conductive wires, and reduce heat generation by integrated circuits. The low-k dielectric layer 112 generally has a dielectric constant k less than 3.9.

Figure 1B:
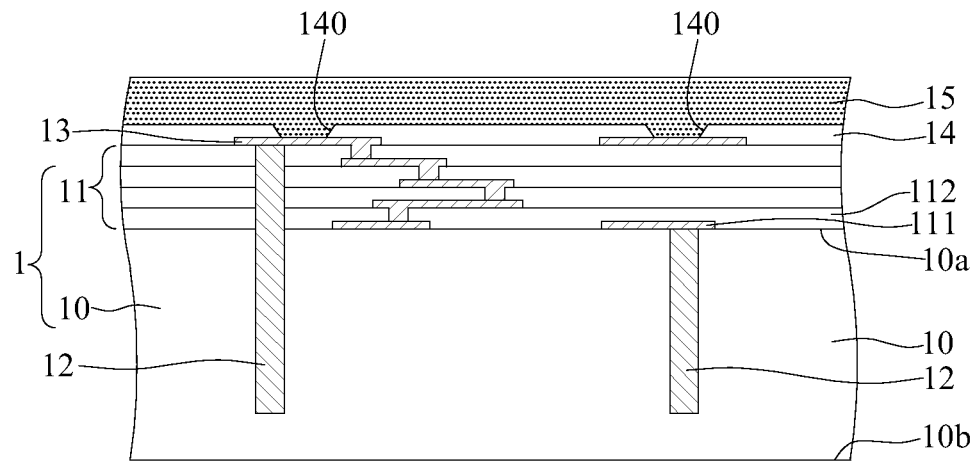

Referring to FIG. 1B, a plurality of openings 140 is formed in the first insulating layer 14 so as to correspondingly expose the top metal layer 13. Further, a buffer layer 15, made of, for example, silicone or other encapsulating materials, is formed on the top metal layer 13 and the first insulating layer 14.

Figure 1C:
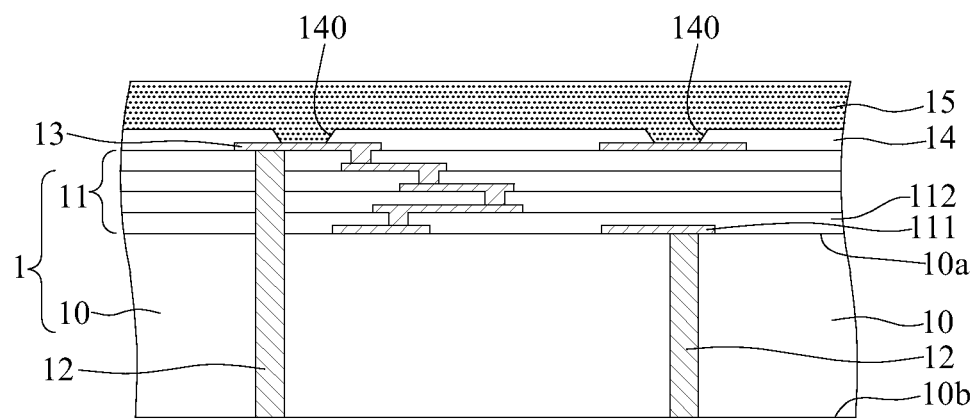

Referring to FIG. 1C, a part of the chip 1 is removed from the second surface 10b through, for example, grinding so as to expose the other end of each of the metal posts 12.

Figure 1D:
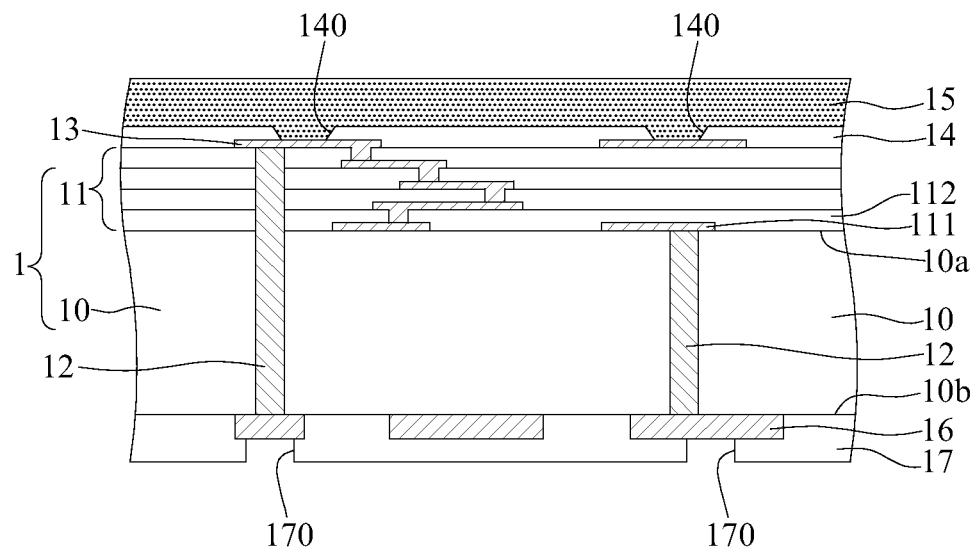
Figure 1D:
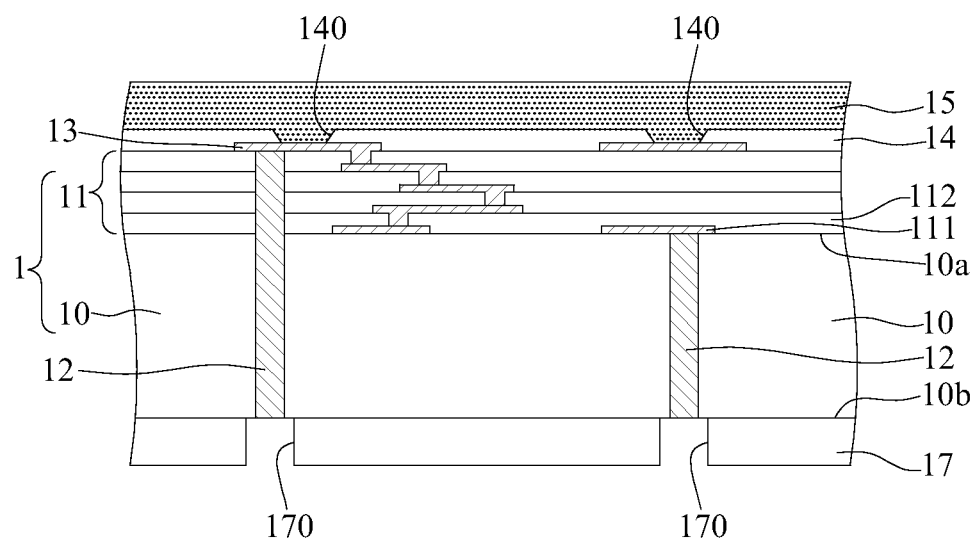

Referring to FIG. 1D, an RDL (redistribution layer) process is performed such that a wiring layer 16 is formed on the second surface 10b of the chip 10 and electrically connected to the metal posts 12. Furthermore, a second insulating layer 17 is formed on the second surface 10b and the wiring layer 16, and a plurality of openings 170 are formed in the second insulating layer 17 for correspondingly exposing portions of the wiring layer 16. Alternatively, as shown in FIG. 2D', only the second insulating layer 17 is formed on the second surface 10b, and a plurality of openings 170 are formed in the second insulating layer 17 for correspondingly exposing the metal posts 12.

Figure 1E:
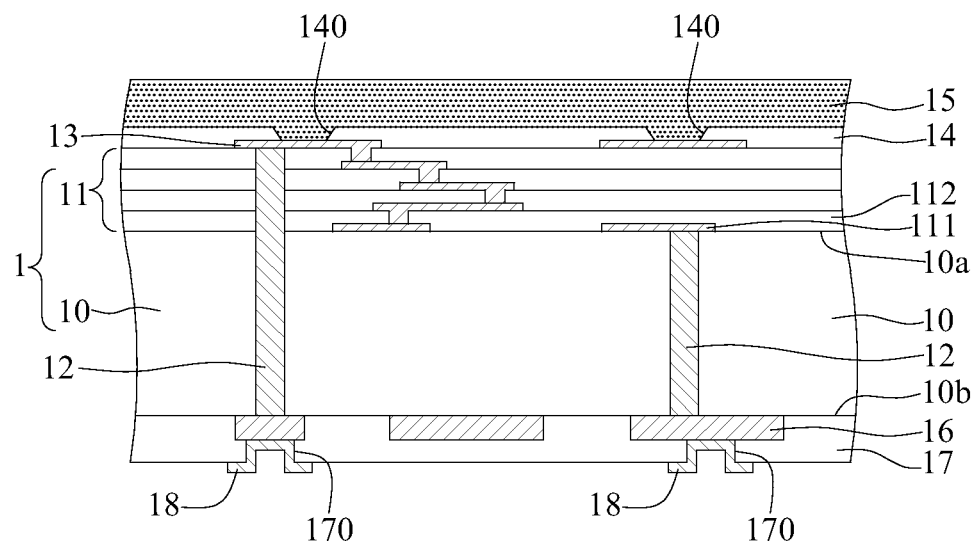

Referring to FIG. 1E, a UBM (under bump metallurgy) layer 18 is formed on the portions of the wiring layer 16 exposed through the openings 170 of the second insulating layer 17 and surfaces of the second insulating layer 17 around the exposed portions of the wiring layer 16.

Figure 1F:
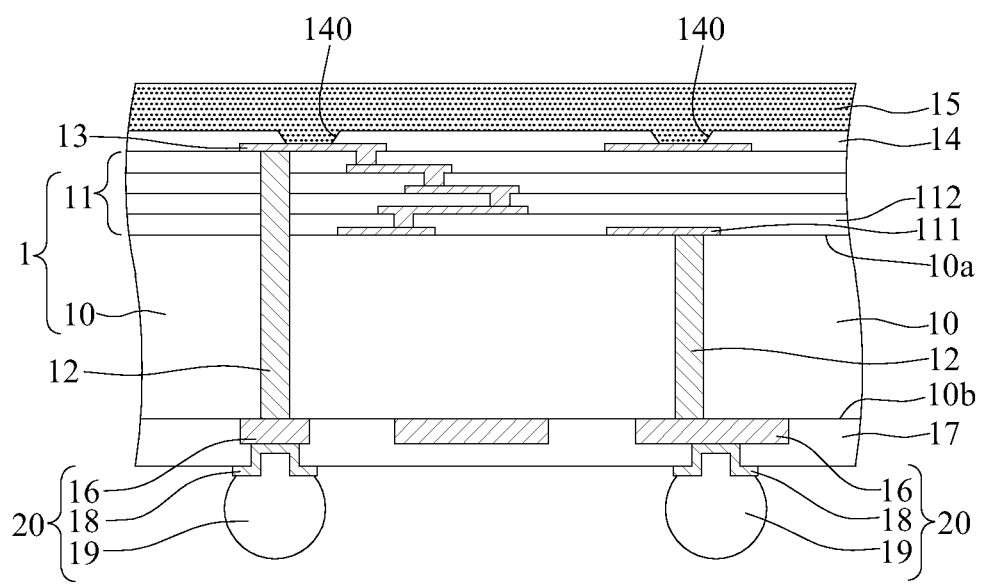
Figure 1F:
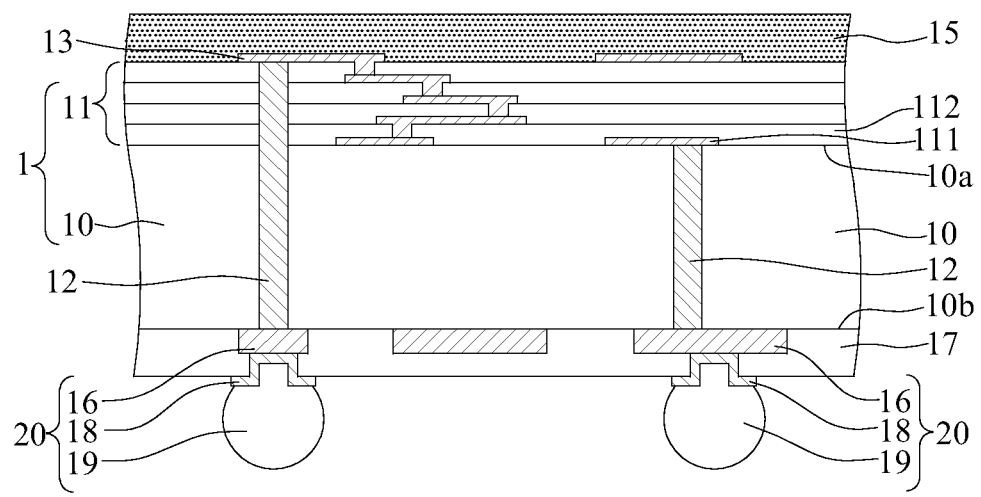

Referring to FIG. 1F, a plurality of metal bumps 19 are implanted on the UBM layer 18 such that the metal bumps 19 in combination with the UBM layer 18 and the wiring layer 16 constitute a plurality of conductive elements 20. Thereafter, the structure can be singulated into a plurality of units (not shown).

In another embodiment, as shown in FIG. 1F', the buffer layer 15 can be directly formed on the build-up structure 11 and the top metal layer 13 without formation of the first insulating layer 14.

The present invention further discloses a semiconductor device, which comprises: a chip 1 having a silicon-based layer 10 with opposite first and second surfaces 10a, 10b, and a build-up structure 11 formed on the silicon-based layer 10 and comprising at least a metal layer 111 and a low-k dielectric layer 112 alternately stacked on one another; a plurality of metal posts 12 disposed on the silicon-based layer 10 and each having one end electrically connected with the metal layer 111 and the other end exposed from the second surface 10b of the silicon-based layer 10; and a buffer layer 15 formed on the build-up structure 11.

The above-described semiconductor device can further comprise a plurality of conductive elements 20 disposed on the second surface 10b of the silicon-based layer 10 and electrically connected with the metal posts 12.

The above-described semiconductor device can further comprise a top metal layer 13 and a first insulating layer 14 formed between the build-up structure 11 and the buffer layer 15, wherein the top metal layer 13 is electrically connected to the metal posts 12 and the metal layer 111, and the first insulating layer 14 has a plurality of openings 140 for correspondingly exposing the top metal layer 13.

Further, the buffer layer 15 can be made of silicone or other encapsulating materials.

The above-described semiconductor device can further comprise a second insulating layer 17 formed on the second surface 10b of the silicon-based layer 10 and having a plurality of openings 170 for correspondingly exposing the conductive elements 20.

The above-described semiconductor device can further comprise a second insulating layer 17 formed on the second surface 10b of the silicon-based layer 10 and having a plurality of openings 170 for correspondingly exposing the metal posts 12. The conductive elements 20 can comprise a UBM layer 18 formed on the metal posts 12 exposed through the openings 170 and surfaces of the second insulating layer 17 around the exposed metal posts 12, and a plurality of metal bumps 19 implanted on the UBM layer 18.

The above-described semiconductor device can further comprise a second insulating layer 17 formed on the second surface 10b of the silicon-based layer 10 and having a plurality of openings 170. The conductive elements 20 comprise a wiring layer 16, a UBM layer 18 and a plurality of metal bumps 19, wherein portions of the wiring layer 16 are correspondingly exposed through the openings 170, the UBM layer 18 is formed on the portions of the wiring layer 16 exposed through the openings 170 and surfaces of the second insulating layer 17 around the exposed portions of the wiring layer 16, and the metal bumps 19 are implanted on the UBM layer 18.

According to the present invention, since the metal posts connect the electrical contacts of the first surface (active surface) to the second surface (non-active surface) of the chip, the second surface of the chip can be used for electrically connecting an external electronic component such as a circuit board or a packaging substrate. Therefore, the low-k dielectric layer of the chip is positioned far from the metal bumps, the underfill material and the external electronic component. As such, the present invention avoids the generation of high thermal stress during a flip-chip process caused by a mismatch of the coefficients of thermal expansion of the low-k dielectric layer and adjacent material, thereby avoiding circuit or interface delamination or cracking. Further, the buffer layer covering the low-k dielectric layer can protect the low-k dielectric layer against damage caused by external influences. Furthermore, the semiconductor device eliminates the need of a carrier board required in the prior art, thereby reducing the fabrication cost. In addition, the present invention allows the fabrication processes to be performed at the wafer level so as to save fabrication time and cost.

The above-described descriptions of the detailed embodiments are provided to illustrate the preferred implementation according to the present invention, and are not intended to limit the scope of the present invention. Accordingly, many modifications and variations completed by those with ordinary skill in the art will fall within the scope of the present invention as defined by the appended claims.

What is claimed is:

1. A semiconductor device, comprising:
   a chip having a silicon-based layer with opposite first and second surfaces and a build-up structure formed directly on the first surface of the silicon-based layer, the build-up structure comprising a plurality of metal layers and a plurality of dielectric layers alternately stacked on one another, wherein all of the dielectric layers have a dielectric constant less than 3.9;
   a top metal layer formed on and electrically connected to the build-up structure;
   a plurality of metal posts disposed in the silicon-based layer, at least one of the metal posts having one end thereof electrically connected with the top metal layer and the other end exposed from the second surface of the silicon-based layer; and
   a buffer layer formed on the build-up structure and the top metal layer.

2. The semiconductor device of claim 1, further comprising a first insulating layer formed between the build-up structure and the buffer layer for covering the top metal layer and having a plurality of openings for the buffer layer to be formed on the top metal layer.

3. The semiconductor device of claim 1, wherein the buffer layer is made of silicone or other encapsulating materials.

4. The semiconductor device of claim 1, further comprising a plurality of conductive elements formed on the second surface of the silicon-based layer and electrically connected with the metal posts.

5. The semiconductor device of claim 4, further comprising a second insulating layer formed on the second surface of the silicon-based layer and having a plurality of openings for correspondingly exposing the conductive elements.

6. The semiconductor device of claim 4, further comprising a second insulating layer formed on the second surface of the silicon-based layer and having a plurality of openings for correspondingly exposing the metal posts, wherein the conductive elements each comprise a UBM layer formed on the metal posts exposed through the openings of the second insulating layer and surfaces of the second insulating layer around the exposed metal posts, and a plurality of metal bumps implanted on the UBM layer.

7. The semiconductor device of claim 4, further comprising a second insulating layer formed on the second surface of the silicon-based layer and having a plurality of openings, wherein the conductive elements each comprise a wiring layer with portions thereof correspondingly exposed from the openings of the second insulating layer, a UBM layer formed on the portions of the wiring layer exposed through the openings of the second insulating layer and surfaces of the second insulating layer around the exposed portions of the wiring layer, and a plurality of metal bumps implanted on the UBM layer.

8. A fabrication method of a semiconductor device, comprising the steps of:
  providing a chip having a silicon-based layer and a build-up structure, wherein the silicon-based layer has opposite first and second surfaces, and the build-up structure is disposed directly on the first surface and comprises a plurality of metal layers and a plurality of dielectric layers alternately stacked on one another, all of the dielectric layers have a dielectric constant less than 3.9, a top metal layer is formed on and electrically connected to the build-up structure, and a plurality of metal posts are disposed in the silicon-based layer and at least one of the metal posts has one end thereof electrically connected with the top metal layer;
  forming a buffer layer on the build-up structure; and
  removing a part of the chip from the second surface so as to expose the other end of each of the metal posts.

9. The method of claim 8, further comprising the steps of forming a first insulating layer on the build-up structure and the top metal layer, the first insulating layer having a plurality of openings for correspondingly exposing a portions of the top metal layer; and forming the buffer layer on the first insulating layer and in the plurality of openings.

10. The method of claim 8, wherein the buffer layer is made of silicone or other encapsulating materials.

11. The method of claim 8, further comprising the step of forming a plurality of conductive elements on the second surface of the silicon-based layer, the conductive elements being electrically connected with the metal posts.

12. The method of claim 11, further comprising the step of forming a second insulating layer on the second surface, the second insulating layer having a plurality of openings for correspondingly exposing the conductive elements.

13. The method of claim 11, further comprising the step of forming a second insulating layer on the second surface, wherein the second insulating layer has a plurality of openings for correspondingly exposing the metal posts, and the conductive elements comprise a UBM layer formed on the metal posts exposed through the openings of the second insulating layer and surfaces of the second insulating layer around the exposed metal posts, and a plurality of metal bumps implanted on the UBM layer.

14. The method of claim 11, further comprising the step of forming a second insulating layer on the second surface, wherein the second insulating layer has a plurality of openings, and the conductive elements comprise a wiring layer with portions thereof correspondingly exposed from the openings of the second insulating layer, a UBM layer formed on the portions of the wiring layer exposed through the openings of the second insulating layer and surfaces of the second insulating layer around the exposed portions of the wiring layer, and a plurality of metal bumps implanted on the UBM layer.

* * * * *